United States Patent [19]

Urban

[11] 4,268,339

[45] May 19, 1981

[54] PROCESS FOR RADIATION CURED CONTINUOUS LAMINATES

[75] Inventor: Raymond C. Urban, Ballston Lake, N.Y.

[73] Assignee: General Electric Company, Schenectady, N.Y.

[21] Appl. No.: 58,248

[22] Filed: Jul. 17, 1979

[51] Int. Cl.³ .............................................. B05D 3/06
[52] U.S. Cl. ..................................... 156/272; 427/44; 427/54.1
[58] Field of Search .................. 427/54.1, 44; 156/272

[56] References Cited

U.S. PATENT DOCUMENTS

| | | | |
|---|---|---|---|
| 2,858,259 | 10/1958 | Lawton et al. | 427/36 |
| 2,906,678 | 9/1959 | Lawton et al. | 427/36 |
| 3,146,146 | 8/1964 | Anderson | 156/272 |
| 3,398,044 | 8/1968 | Plueddemann | 156/272 |
| 3,424,638 | 1/1969 | Marans | 156/272 |
| 3,515,615 | 6/1970 | Okada et al. | 156/272 |
| 3,701,683 | 10/1972 | Wills et al. | 427/44 |
| 3,810,816 | 5/1974 | Zachariades | 427/44 |
| 4,119,743 | 10/1978 | Lu | 427/54.1 |

Primary Examiner—John H. Newsome
Attorney, Agent, or Firm—Morgan, Finnegan, Pine, Foley and Lee

[57] ABSTRACT

A novel method of making continuous laminates by irradiation of a continuous sandwich of a radiation curable substrate and a metal foil is described. The method is especially useful for use in conjunction with substrates such as polyethylene in flexible printed circuit applications.

1 Claim, No Drawings

PROCESS FOR RADIATION CURED CONTINUOUS LAMINATES

This invention relates to curing laminates continuously by irradiation. More particularly, it relates to the use of X-rays, electron beams, or ultraviolet radiation to cure and bind laminates consisting of a continuous substrate and including a layer of metallic foil, either embedded within the substrate or disposed on an upper surface thereof.

BACKGROUND OF THE INVENTION

It is known that in the formation of a flexible printed circuit board, a layer of conductive metal foil is laminated to a layer of dielectric substrate, such as a thermosettable resin plastic, e.g., peroxide-catalyzed polyethylene. Alternatively, when the laminate is intended for use as a less-flexible, more rigid printed circuit board, in order to increase the strength of the laminate, layers of a stiffener, such as cellulose or glass cloth, mat or non-woven paper may be added to the exposed side of the dielectric substrate. Such laminates are produced by placing built up sandwiched discontinuous layers of the metallic foil, the substrate, and if desired, the stiffener, into a press or other similar device, and curing the resin layer of the laminate, e.g., with the use of peroxide, in combination with heat in a high pressure press. Clark Schwebel Fiberglass Corp., for example, sells a curable polyethylene impregnated glass cloth suitable for this purpose under the tradename RENATION.

It is also known from Lawton and Bueche, U.S. Pat. No. 2,906,678 that polyethylene can be cured in shapes such as tapes, sheets, various containers and bottles by allowing high energy irradiation obtained from high voltage accelerating apparatus to impinge on such shapes. The disclosure of the patent is incorporated herein by reference.

It has now been found that laminates can be produced continuously, without the need for a high pressure press, if a different substrate cure mechanism is selected.

It is an object of the present invention to eliminate the cumbersome and costly curing step of using a heat under pressure in combination with peroxide by curing the laminate continuously by irradiation.

It is a further object of the subject invention to provide laminates with the desired electrical properties, yet at reduced manufacturing costs.

DESCRIPTION OF THE INVENTION

According to the present invention, there is provided a method of making a continuous laminate comprising providing a continuous layer of a radiation-curable substrate and a continuous layer of metallic foil, forming said substrate and said foil into a sandwich, and continuously passing said sandwich through radiation from a radiation source until said substrate is substantially completely cured.

In the practice of an invention, a laminate is formed by bonding a sheet layer of metallic foil to a continuous dielectric substrate such as a film or foil or multilayer composite of films or foils of a radiation-curable resin and a metal foil, and after curing of the laminate, the layer of metallic foil is suitable for etching in known ways to form the conductive paths of a printed circuit board. Copper foil sheet is most often used because it is the most economical foil having good electrical conductive characteristics, although aluminum and other metals will also serve. The substrate may be either flexible or rigid, and when it is desired to produce a flexible jumper cable, a plurality of individual strips of conductor material may be embedded between two sheets of polyethylene dielectric material. The radiation-curable substrates which are generally employed include polyethylene in a filled or unfilled condition, e.g., impregnated in cellulose or glass cloth, mat, or non-woven form, ethylene/propylene/diene rubber and compounds, or various copolymers with ethylene that have adequate electrical properties, also filled or un-filled. When it is desired that the resulting printed circuit board be rigid, as for example, when intended to serve as a chassis, etc., layers of stiffener material are sandwiched to the substrate, with the layers of stiffener being made of glass cloth, unidirectional glass reinforcements, or papers, and the like.

In the first step, the continuous composite layers of the sheet of metal foil, the radiation-curable substrate, and if desired, any continuous sheets of stiffener, are sandwiched together in a decidedly non-conventional manner, i.e., they are taken off rolls and instead of being cut, they are fed to apparatus, such as a calender, which sandwiches them together continuously. After the sandwiching is accomplished, the laminate is then cured by continuously exposing the sandwich to a source of radiation. The source of radiation can consist of electrons, ultraviolet rays or X-rays.

DESCRIPTION OF THE PREFERRED EMBODIMENT

A continuous laminate suitable for use after cutting as printed circuit boards is formed by feeding at least one layer of radiation curable core, a layer of glass cloth, and an upper sheet layer of copper foil into a calendar to form a continuous sandwich. The copper foil employed is generally between 0.001 and 0.003 inches thick. The calendar is a machine consisting of two or more rollers and squeezes the layers into a continuous sandwich. The latter is then feed to a radiation zone during which the resin is completely cured and the layers are bonded together. Radiation may be by electron beam, X-rays, ultraviolet, or other known radiation processes, but it is preferred to use an electron accelerating apparatus of the type described in the above-mentioned Lawton and Bueche patent.

Following the curing step, the laminate may be rolled up or cut and stacked in sheets. Printed circuits may be produced from the laminates by methods well known in the art. For example, an acid-reactive metal surface sheet on the laminate may be printed with photo-resistant inks through a mask overlay. The inks are then exposed to light which cause them to develop, thereby becoming acid resistanct, such that all parts of the metal foil except those areas treated with the photo-resistant ink can be etched away by acid leaving the desired wiring pattern.

It is noted that the subject process is not limited to the curing of a polyethylene substrate, but could also be used for other radiation-curable compounds, such as ethylene/propylene rubber and compounds, ethylene/propylene/diene rubber and compounds, various copolymers with ethylene that have adequate electrical properties, and other known insulation materials. The only requirement is that they be capable of being cured with irridation. It can be seen that the subject process eliminates the cumbersome and costly steps involved in prior art processes which require the use of high pressure and temperature platen presses and the like, and the subject process has particular application in the manufacture of flexible and rigid printed circuit boards.

It is to be understood that changes may be made in the particular embodiment of the invention in light of the above teachings, but that these will be within the full scope of the invention as defined by the appended claims.

I claim:

1. A method of making a continuous laminate comprising providing a continuous layer of a radiation curable substrate selected from the group consisting of polyethylene, ethylene/propylene/diene rubber, and polypropylene, said substrate including a layer of stiffener selected from the group consisting of glass cloth, glass mat and glass paper and a continuous layer of copper foil, forming said substrate, said layer of stiffener and said foil into a sandwich, and continuously passing said sandwich through radiation from a radiation source selected from the group consisting of electrons, X-rays and ultraviolet rays.

* * * * *